(12) United States Patent
Varipatis et al.

(10) Patent No.: US 12,127,362 B2
(45) Date of Patent: Oct. 22, 2024

(54) ENCAPSULATED PRINTED CIRCUIT BOARD AND A METHOD OF ENCAPSULATING A PRINTED CIRCUIT BOARD

(71) Applicant: BLACK & DECKER INC., New Britain, CT (US)

(72) Inventors: Michael Varipatis, Fallston, MD (US); Nathan J. Osborne, Baltimore, MD (US); Alfred M. Irungu, Nottingham, MD (US); Ryan Klee, Baltimore, MD (US); Nicholas J. Garibaldi, Baltimore, MD (US); William T. Lunsford, V, Bel Air, MD (US); Nathan J. Cruise, Phoenix, MD (US)

(73) Assignee: BLACK & DECKER INC., New Britain, CT (US)

( * ) Notice: Subject to any disclaimer, the term of this patent is extended or adjusted under 35 U.S.C. 154(b) by 682 days.

(21) Appl. No.: 15/627,919

(22) Filed: Jun. 20, 2017

(65) Prior Publication Data
US 2017/0365826 A1   Dec. 21, 2017

Related U.S. Application Data

(60) Provisional application No. 62/426,634, filed on Nov. 28, 2016, provisional application No. 62/352,149, filed on Jun. 20, 2016.

(51) Int. Cl.
| | | |
|---|---|---|
| *H05K 7/02* | (2006.01) | |
| *G06F 1/16* | (2006.01) | |
| *H01M 10/42* | (2006.01) | |
| *H01M 50/186* | (2021.01) | |
| *H01M 50/284* | (2021.01) | |
| *B29L 31/00* | (2006.01) | |

(Continued)

(52) U.S. Cl.
CPC ............. *H05K 7/02* (2013.01); *G06F 1/1635* (2013.01); *H01M 10/425* (2013.01); *H01M 50/186* (2021.01); *H01M 50/284* (2021.01); *B29L 2031/7146* (2013.01); *H01M 50/184* (2021.01); *H01M 50/204* (2021.01); *H01M 50/227* (2021.01); *H01M 50/247* (2021.01); *H01M 2220/30* (2013.01); *H05K 3/284* (2013.01); *H05K 2201/10189* (2013.01)

(58) Field of Classification Search
CPC .. H05K 9/00; H05K 7/16; H05K 1/14; H05K 1/18; H05K 1/181–188; H01L 23/10; H01L 23/42; H01L 23/057; H01M 50/20; H01M 50/183
USPC ....... 361/761, 771, 816, 818; 174/35 R, 350, 174/520; 257/787–790
See application file for complete search history.

(56) References Cited

U.S. PATENT DOCUMENTS 3,662,150 A * 5/1972 Hartung ................ H05K 1/0212
219/209
4,819,041 A * 4/1989 Redmond ................ H01L 23/24
257/687

(Continued)

*Primary Examiner* — Tuan T Dinh
(74) *Attorney, Agent, or Firm* — Michael Aronoff

(57) ABSTRACT

The present disclosure is directed to an encapsulated printed circuit board populated with a variety of components and a method of encapsulating a printed circuit board. The printed circuit board is partially encapsulated with a low pressure molded material to form at least a portion of a potting boat. The potting boat is filled with an encapsulating material.

11 Claims, 25 Drawing Sheets

(51) Int. Cl.
*H01M 50/184* (2021.01)
*H01M 50/204* (2021.01)
*H01M 50/227* (2021.01)
*H01M 50/247* (2021.01)
*H05K 3/28* (2006.01)

(56) References Cited

U.S. PATENT DOCUMENTS

| | | | | |
|---|---|---|---|---|
| 5,166,864 A * | 11/1992 | Chitwood | ............ | H05K 1/0218 174/351 |
| 5,394,304 A * | 2/1995 | Jones | ............ | B65B 53/02 174/256 |
| 5,521,437 A * | 5/1996 | Oshima | ............ | H05K 1/142 257/E23.172 |
| 5,566,055 A * | 10/1996 | Salvi, Jr. | ............ | H05K 9/0037 361/816 |
| 5,625,536 A * | 4/1997 | Soyano | ............ | H01L 23/24 361/719 |
| 5,689,089 A * | 11/1997 | Polak | ............ | H01L 23/057 174/521 |
| 5,795,799 A * | 8/1998 | Hosoya | ............ | H01L 23/24 257/E23.14 |
| 6,120,573 A * | 9/2000 | Call | ............ | B01D 45/08 55/442 |
| 6,147,869 A * | 11/2000 | Furnival | ............ | H05K 7/1432 361/719 |
| 6,219,258 B1 * | 4/2001 | Denzene | ............ | H01R 13/5219 174/358 |
| 6,445,592 B1 * | 9/2002 | Schirmer | ............ | B60R 16/0239 174/260 |
| 6,614,108 B1 * | 9/2003 | Sanftleben | ............ | H01L 23/10 257/678 |
| 6,900,383 B2 * | 5/2005 | Babb | ............ | H01L 23/552 174/394 |
| 7,209,360 B1 * | 4/2007 | Yarza | ............ | H05K 5/064 174/520 |
| 8,169,784 B2 * | 5/2012 | Sakamoto | ............ | H01L 25/162 361/784 |
| 8,276,268 B2 * | 10/2012 | Kapusta | ............ | H05K 1/0218 29/832 |
| 8,279,614 B2 * | 10/2012 | Horten | ............ | H05K 9/0007 361/752 |
| 8,833,726 B2 * | 9/2014 | Geise | ............ | H05K 5/065 249/139 |
| 2004/0158978 A1 * | 8/2004 | Lee | ............ | B29C 70/72 29/841 |
| 2007/0289129 A1 * | 12/2007 | Wing | ............ | H05K 3/305 29/855 |
| 2010/0006327 A1 * | 1/2010 | Yu | ............ | H05K 1/11 174/266 |
| 2010/0065960 A1 * | 3/2010 | Mino | ............ | H01L 23/49551 257/E23.116 |
| 2011/0162949 A1 * | 7/2011 | Dimig | ............ | G07C 9/00944 264/263 |
| 2012/0017436 A1 * | 1/2012 | Wing | ............ | H05K 3/284 29/841 |
| 2012/0018906 A1 * | 1/2012 | Mino | ............ | H01L 23/3107 257/E23.116 |
| 2012/0039052 A1 * | 2/2012 | Valles Rangel | ............ | G05G 1/02 361/752 |
| 2012/0152498 A1 * | 6/2012 | Lyon | ............ | F28D 15/00 165/104.31 |
| 2013/0235537 A1 * | 9/2013 | Swett | ............ | E21B 47/017 361/752 |
| 2014/0050945 A1 * | 2/2014 | Kiger | ............ | H01M 10/425 429/7 |
| 2014/0268579 A1 * | 9/2014 | Nguyen | ............ | H01L 23/42 361/719 |
| 2015/0009640 A1 * | 1/2015 | Stern | ............ | H05K 3/30 361/752 |
| 2015/0077959 A1 * | 3/2015 | Loibl | ............ | H05K 7/10 439/78 |
| 2016/0109669 A1 * | 4/2016 | Moidu | ............ | G02B 6/4267 385/16 |

* cited by examiner

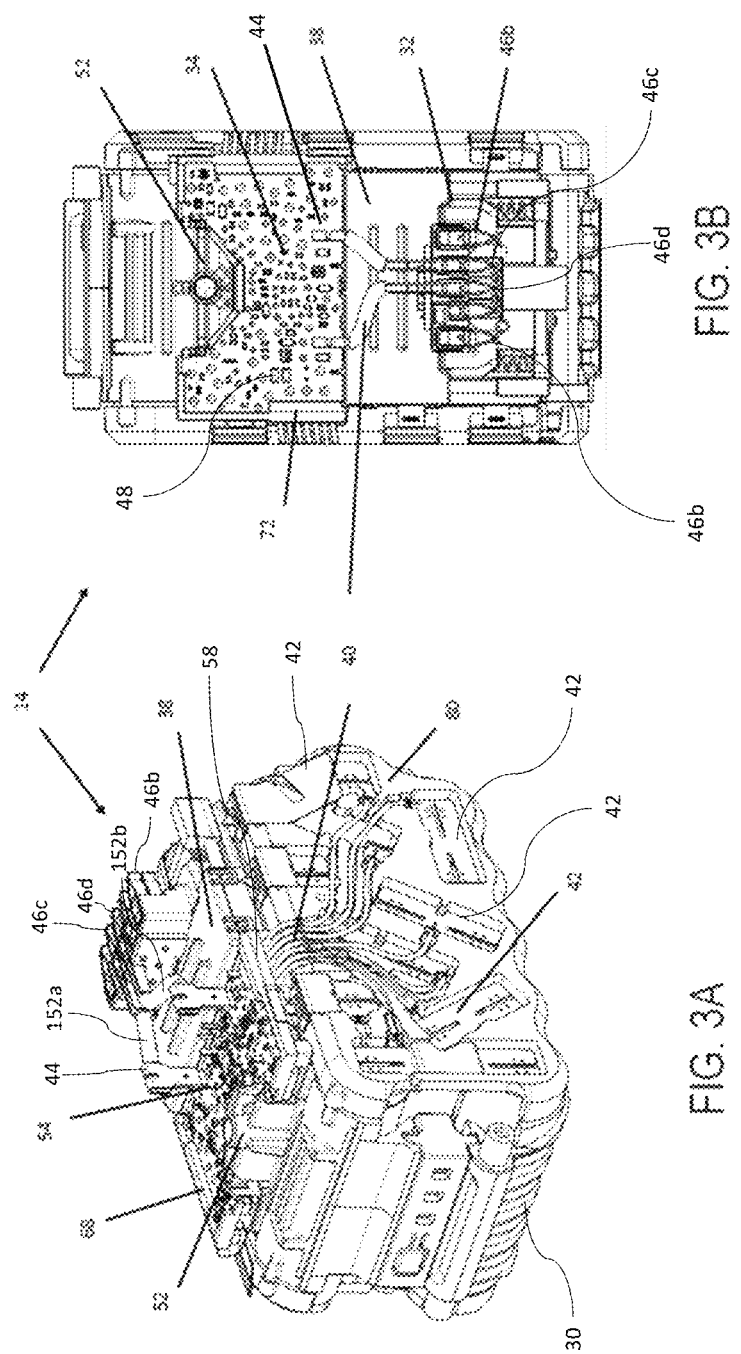

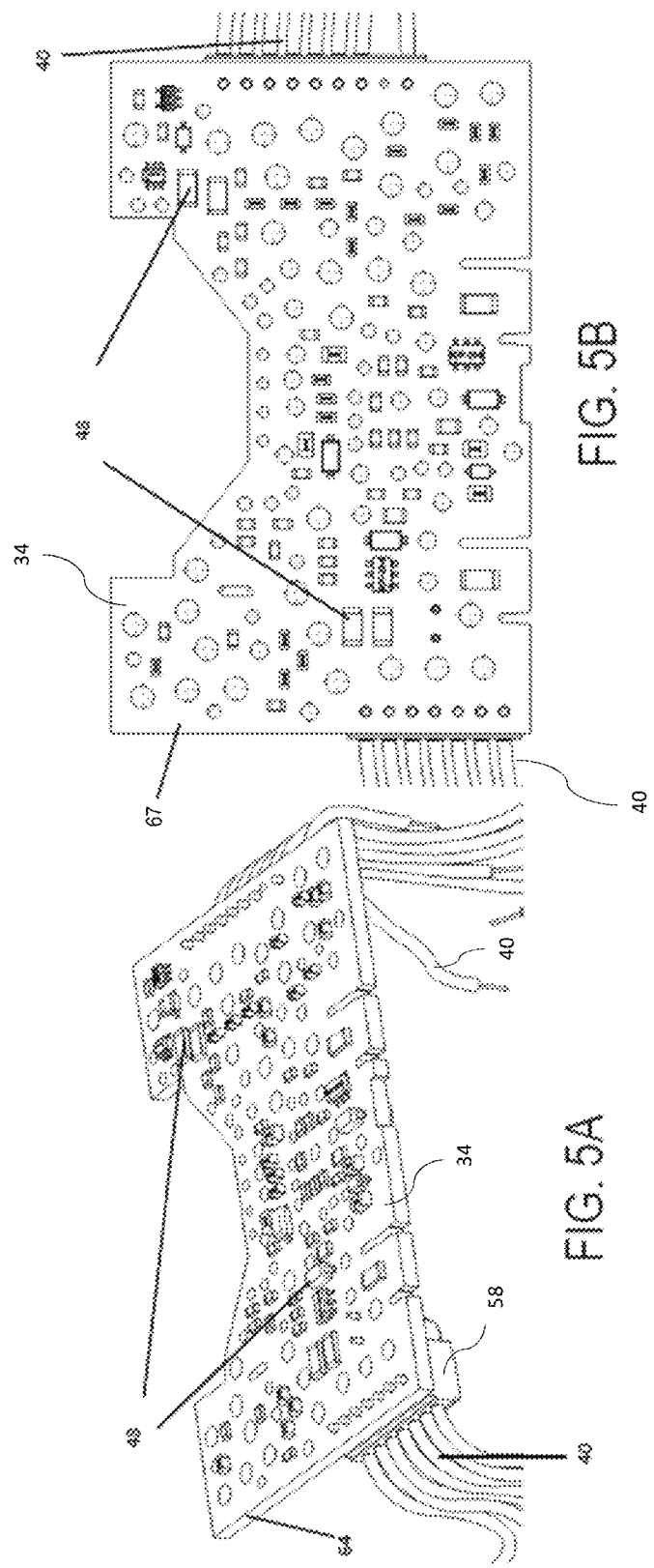

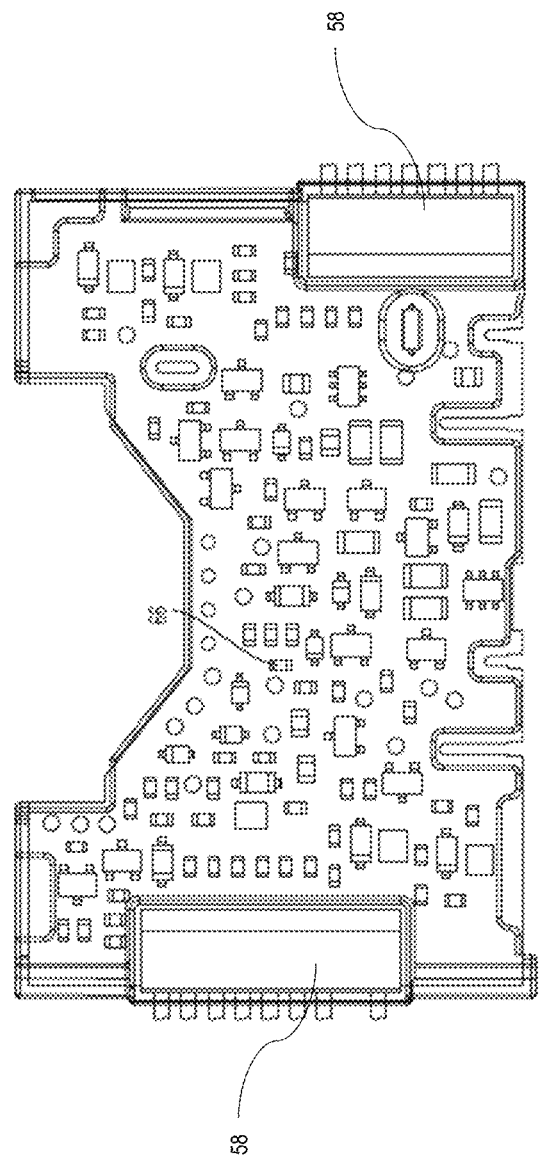

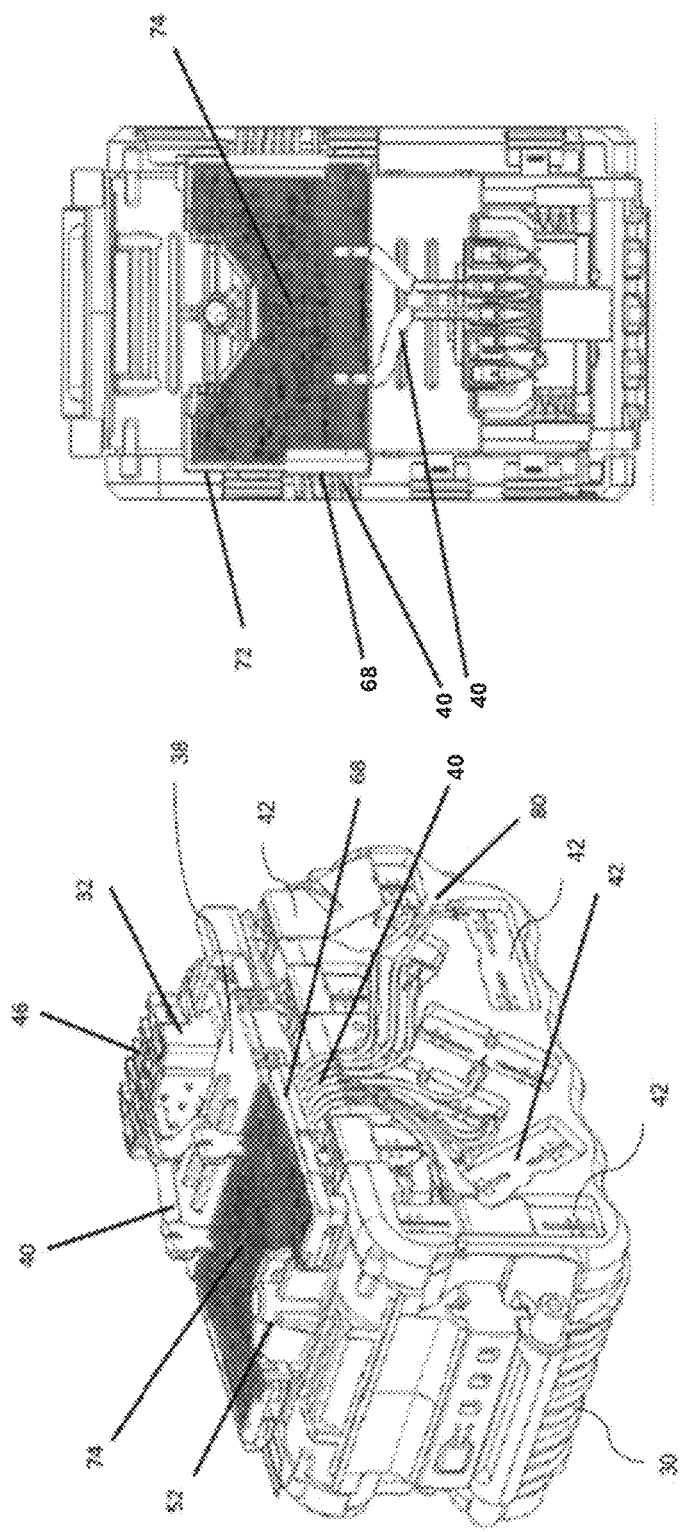

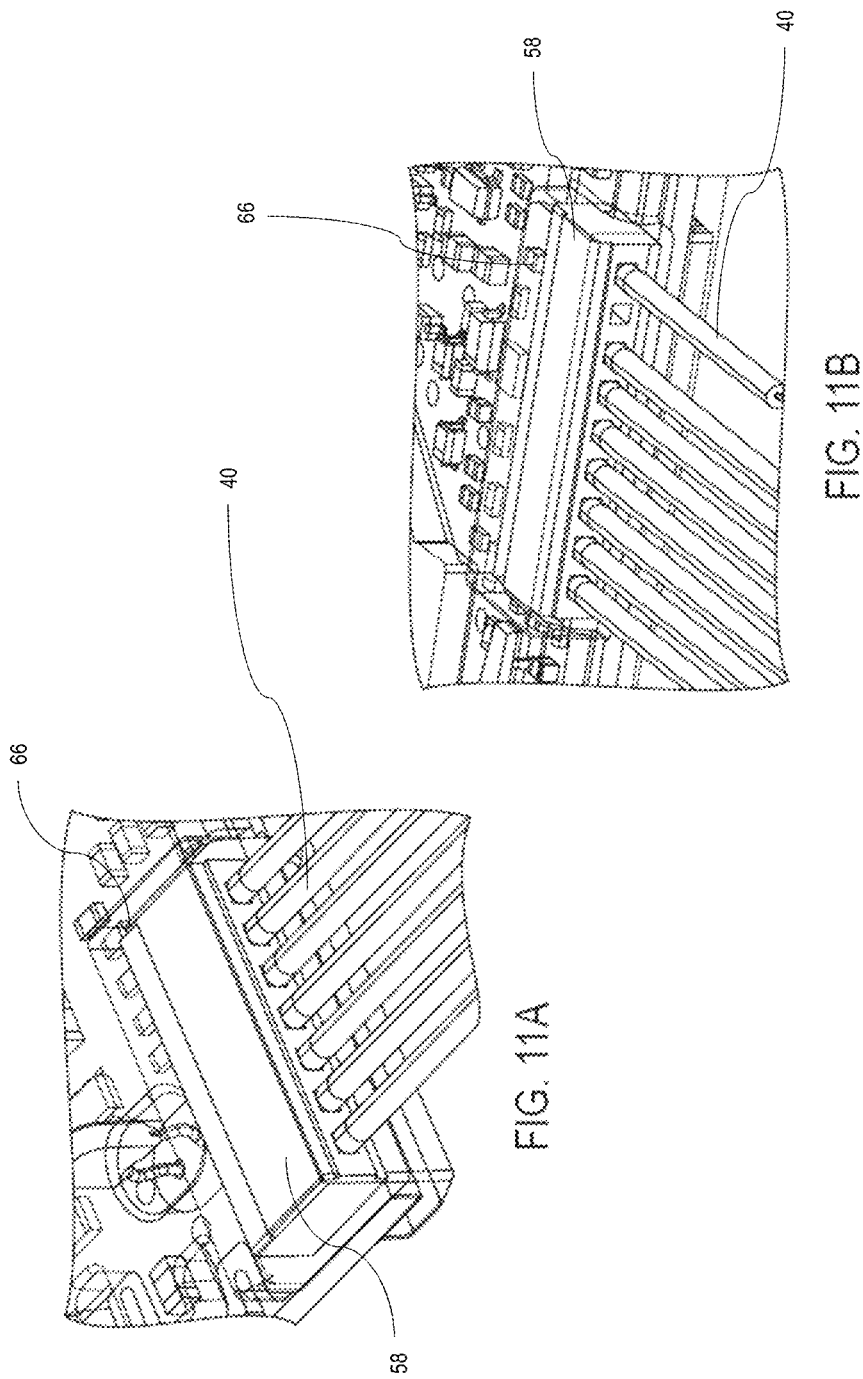

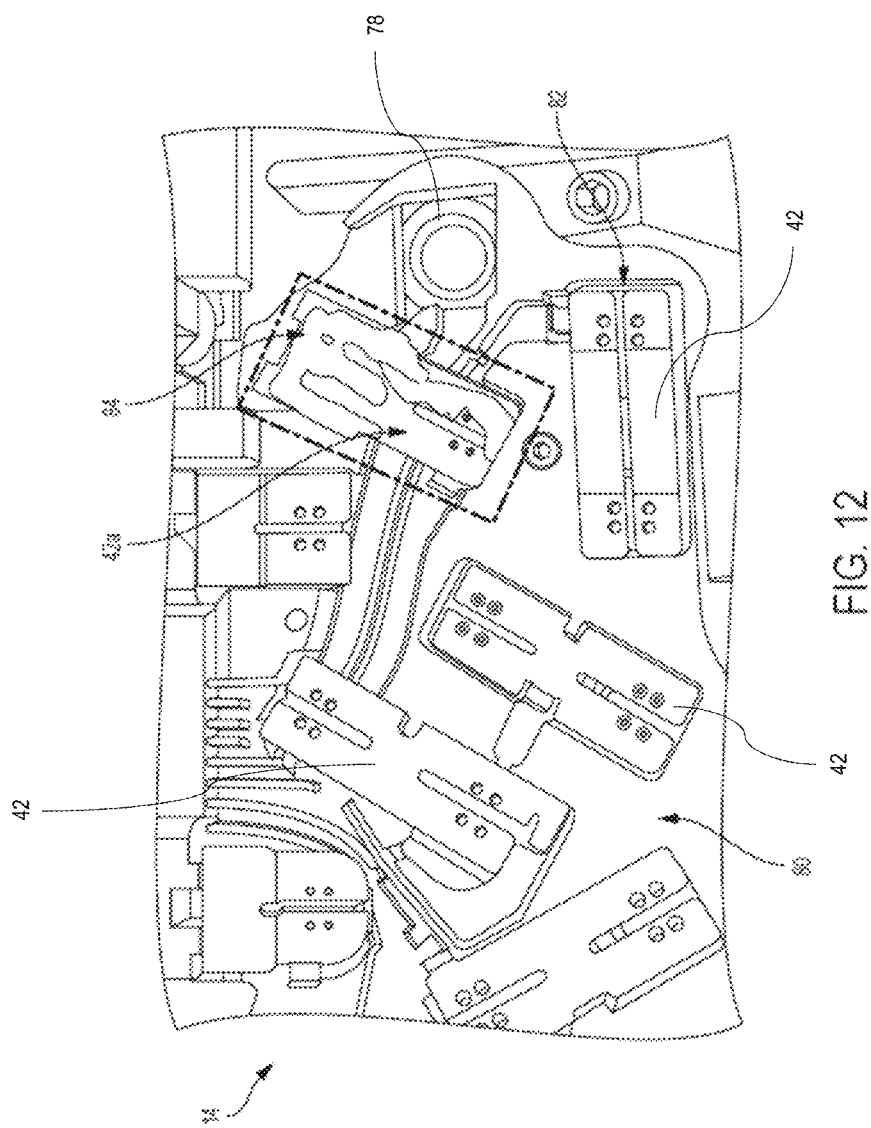

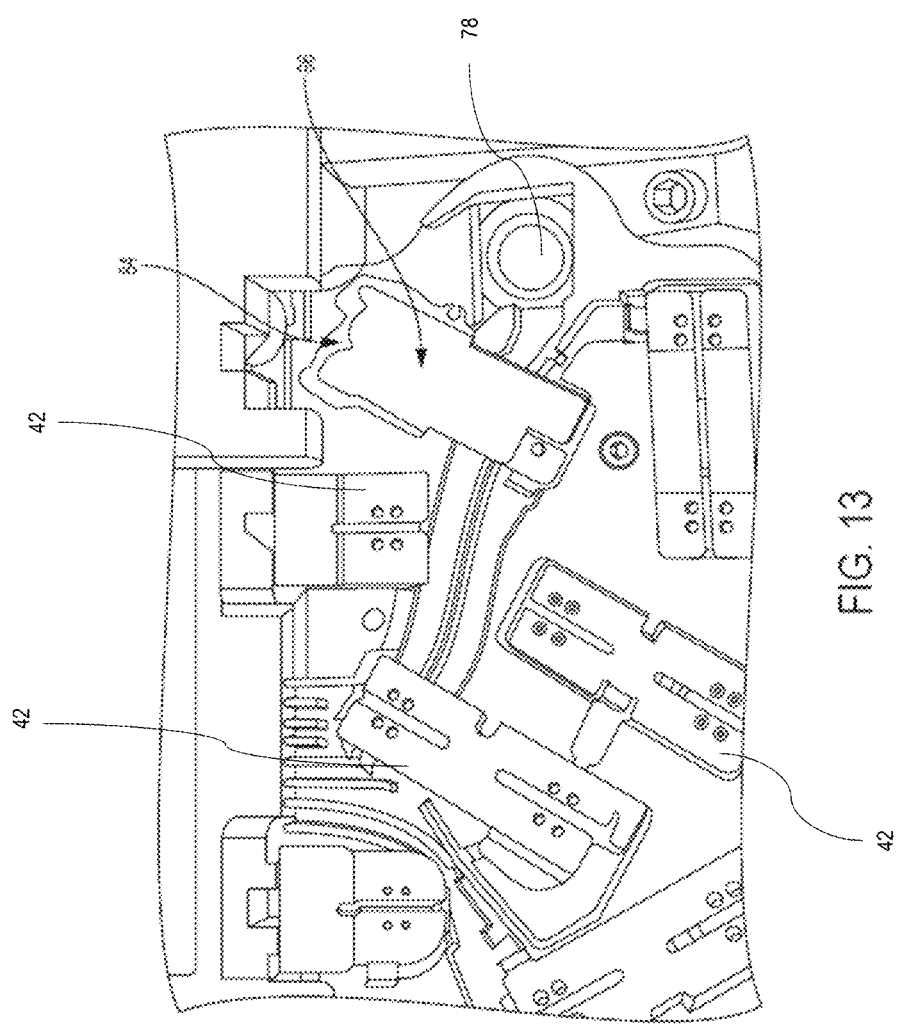

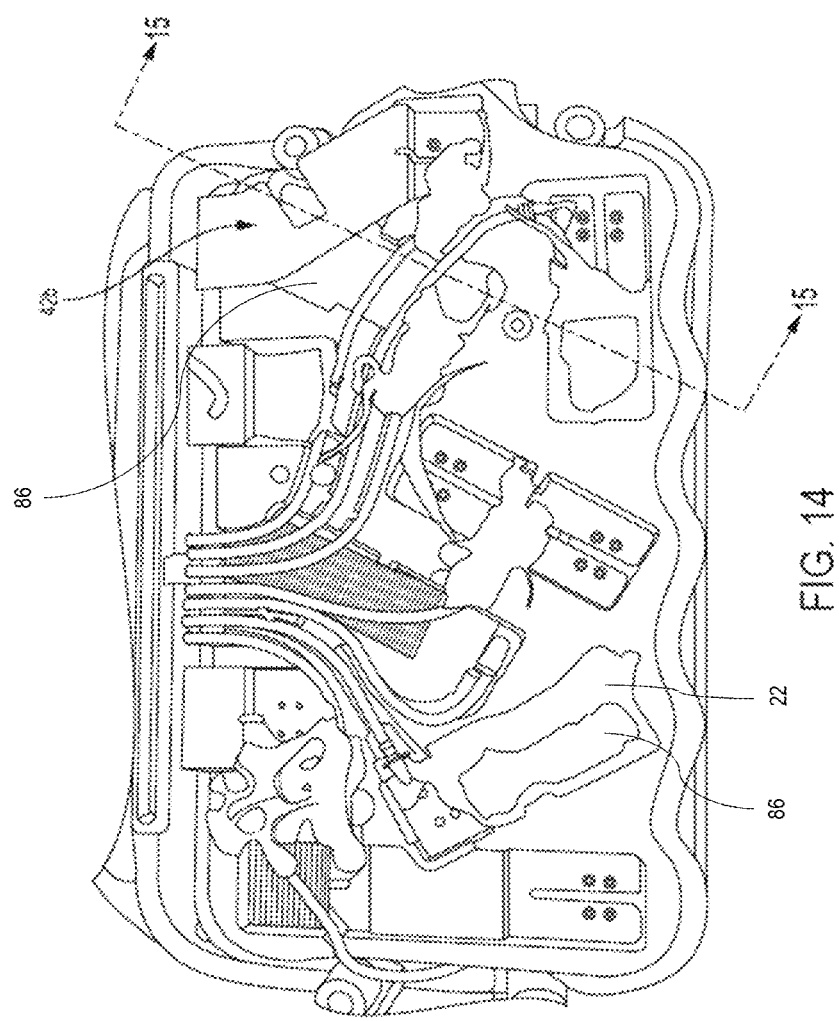

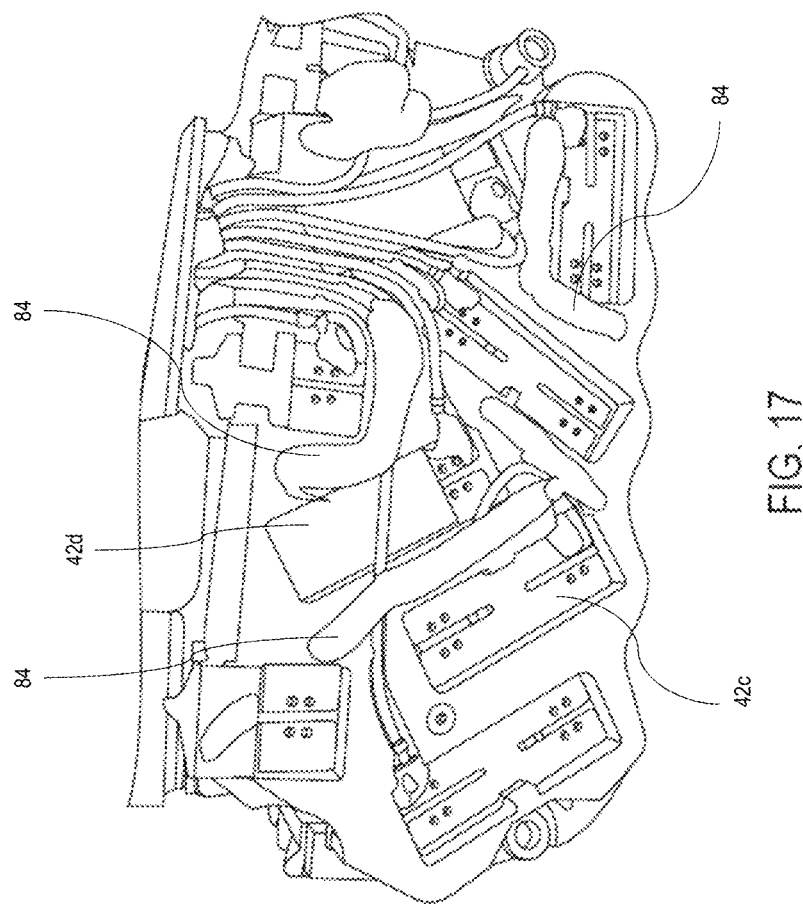

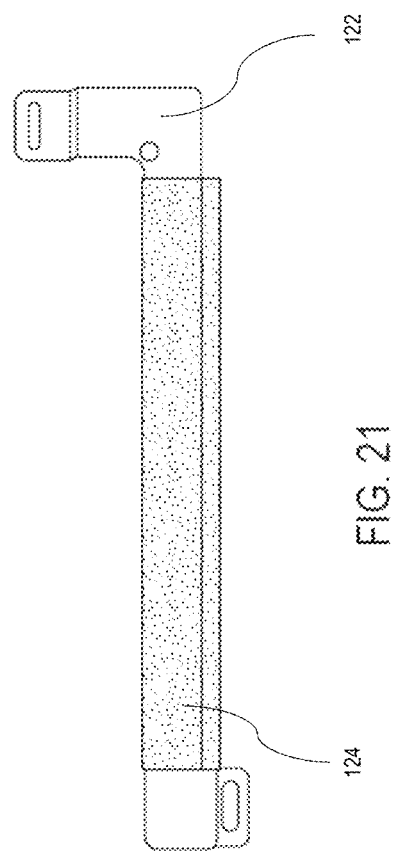

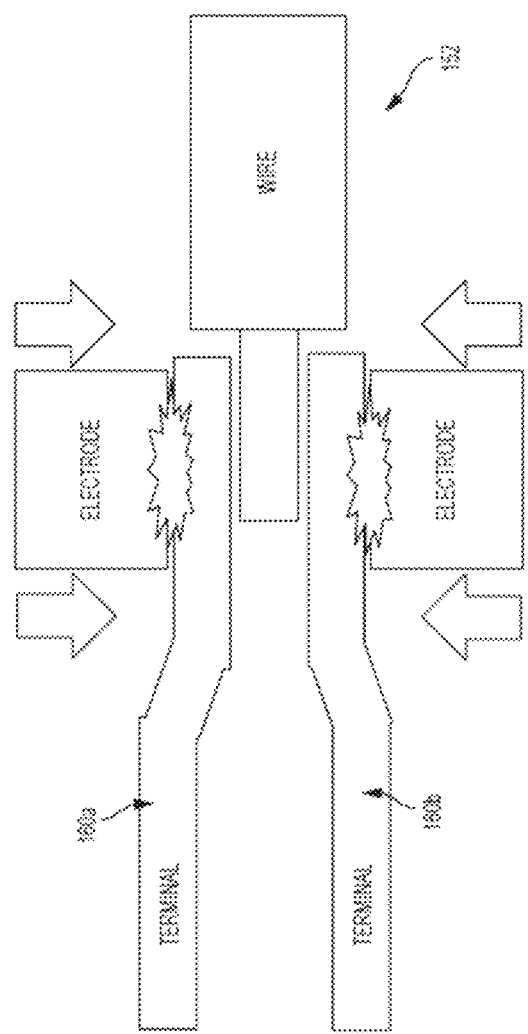

ENCAPSULATED PRINTED CIRCUIT BOARD AND A METHOD OF ENCAPSULATING A PRINTED CIRCUIT BOARD

RELATED APPLICATIONS

This application claims priority under 35 U.S.C. § 119(e) to U.S. Provisional Patent Application No. 62/352,149, filed Jun. 20, 2016, titled "Battery Packs and Methods for Manufacturing Battery Packs" and U.S. Provisional Patent Application No. 62/426,634, filed Nov. 28, 2016, titled, "Low Pressure Molded Printed Circuit Board."

This application also incorporates by reference in their entirety U.S. Pat. No. 9,406,915, issued Aug. 2, 2016, titled "Power Tool System," and U.S. patent application Ser. No. 15/160,485, filed May 20, 2016, titled "Power Tool System."

TECHNICAL FIELD

This application relates to rechargeable battery packs and methods for manufacturing the battery packs. Furthermore, this application relates to a battery pack including features for protecting electronic and electrical components from contamination including water and a method for manufacturing such a battery pack. In one implementation, the battery pack includes a printed circuit board, a low pressure mold material applied to the printed circuit board which encapsulates a first side of the printed circuit board and creates a perimeter wall around and extending from a second side of the printed circuit board thereby defining a volume and a potting material applied to the printed circuit board to fill the volume.

BACKGROUND

Cordless power tools generally utilize removable, rechargeable battery packs. It is common for the battery packs to operate in a variety of environments and operating conditions, many of them extremely harsh and often, the battery packs remain in these harsh environments even when not being used. These environments include wet, rainy and snowy conditions where water can get into the battery pack housing. Whether or not the battery packs are coupled to a power tool, water may find its way into the battery pack. As such, have an egress path for the water is very desirable.

In addition, when the battery packs are operated continuously or in hot environments, they tend to heat up and it is preferable to have air flow paths into and out of the battery pack.

In both of these conditions, it is desirable to include holes in the battery pack housing to allow water to leave the pack and to allow air to flow through the pack.

However, these holes in the battery pack housing may allow various contaminants, such as small dust particulates and metal shards from metal grinding to enter the battery pack. These contaminants and particulates can get under the battery cell insulating sleeve or between adjacent terminals or between adjacent battery cell straps and cause high impedance shorting in the electrical systems which may result in a failed battery pack.

While closing the holes would prevent the contaminants and particulates from entering the battery pack this also prevents fluids, such as water and air, inside the battery pack from exiting the pack.

Various efforts have been made to prevent the negative of effects of contaminants such as water, metal and dust that get inside the battery pack housing. As most of the electronics in the battery pack reside on a printed circuit board (PCB), much attention has been given to protecting the PCB. To this end, injection molded frames or potting boats are precast and attached to the PCB. Thereafter, a potting material is applied to the PCB to encapsulate the electronic components on the PCB. These injection molded frames are costly, require the additional step of molding the frame and applying the frame to the PCB. Furthermore, the injection molded frame cannot be used to encapsulate any portion of the populated PCB.

As such, an improved encapsulated PCB is necessary to more effectively and efficiently protect the electronic components that populate the PCB of the battery pack.

SUMMARY

In order to address the concern of particulates entering the battery pack housing, the battery pack may include one or more features to isolate, insulate or separate the battery cells, terminals and/or battery straps from other battery cells, terminals and/or battery straps in the battery pack.

An aspect of the present invention includes an encapsulated printed circuit board, comprising a printed circuit board having a top side, a bottom side and a perimeter wall coupling the top side and the bottom side; a low pressure molded material applied to the printed circuit board such that a portion of the low pressure molded material extends generally perpendicularly to the top side to create a potting wall extending from the top side generally parallel to the perimeter wall.

Another aspect of the present invention includes the aforementioned encapsulated printed circuit board, wherein the low pressure molded material encapsulates the bottom side.

Another aspect of the present invention includes the aforementioned encapsulated printed circuit board, wherein the low pressure molded material encapsulates a portion of the top side adjacent to an intersection of the top side and the perimeter wall.

Another aspect of the present invention includes the aforementioned encapsulated printed circuit board, wherein the potting wall extending from the top side extends from the top side from the portion of the top side adjacent to the intersection of the top side and the perimeter wall.

Another aspect of the present invention includes the aforementioned encapsulated printed circuit board, wherein the low pressure molded material is a thermoplastic polyamide.

Another aspect of the present invention includes the aforementioned encapsulated printed circuit board, wherein the potting wall and the top side form a volume and a potting material fills the volume.

Another aspect of the present invention includes the aforementioned encapsulated printed circuit board, further comprising at least one lead wire coupled to the printed circuit board and wherein the low pressure molded material encapsulates a portion of the at least one lead wire coupled to the printed circuit board.

Another aspect of the present invention includes an encapsulated printed circuit board, comprising a printed circuit board having a top side, a bottom side and a perimeter wall coupling the top side and the bottom side; a low pressure molded material molded about a majority of the bottom side and at least a portion of the perimeter wall such that a potting wall extends generally perpendicularly to the top side and generally parallel to the perimeter wall at the at least a portion of the perimeter wall.

Another aspect of the present invention includes the aforementioned encapsulated printed circuit board, wherein the low pressure molded material is a thermoplastic polyamide.

Another aspect of the present invention includes the aforementioned encapsulated printed circuit board, wherein the potting wall and the top side form a volume and a potting material fills the volume.

Another aspect of the present invention includes a method of encapsulating a printed circuit board, comprising the steps of providing a printed circuit board having a top side, a bottom side and a perimeter wall coupling the top side and the bottom side; populating the printed circuit board with a plurality of electronic components; applying a low pressure molded material to at least a portion of the perimeter wall such that a portion of the low pressure molded material extends generally perpendicularly to the top side thereby creating a potting wall extending from the top side at the at least a portion of the perimeter wall and generally parallel to the perimeter wall.

Another aspect of the present invention includes the aforementioned method of encapsulating a printed circuit board, wherein creating the potting wall extending from the top side forms a volume defined by the top side and the potting wall and further comprising the step of filling the volume with a potting material.

Another aspect of the present invention includes a method of encapsulating a printed circuit board, comprising the steps of providing a printed circuit board having a top side, a bottom side and a perimeter wall coupling the top side and the bottom side; populating the printed circuit board with a plurality of electronic components; molding a low pressure molded material about a majority of the bottom side and at least a portion of the perimeter wall to form a potting wall that extends generally perpendicularly to the top side and generally parallel to the perimeter wall at the at least a portion of the perimeter wall.

Another aspect of the present invention includes the aforementioned method of encapsulating a printed circuit board, wherein the potting wall and the top side define a volume and further comprising the step of filling the volume with an encapsulating material.

Another aspect of the present invention includes a battery pack comprising a plurality of battery cells, a plurality of battery straps coupling the plurality of battery cells, and a cell holder holding the plurality of battery cells in a fixed position relative to each other. The cell holder includes a plurality of cutouts exposing the plurality of battery straps. The battery pack includes a room temperature vulcanized material applied to at least one of the recesses to cover at least a portion of the corresponding battery strap.

The RTV material provides the advantage of protecting the battery strap from water, dust, metal shards and/or other contaminants.

These and other advantages and features will be apparent from the description and the drawings.

BRIEF DESCRIPTION OF THE DRAWINGS

FIG. 3A is a perspective view of an exemplary core pack of the battery pack of FIG. 1 without potting material.

FIG. 3B is a top view of the exemplary core pack of FIG. 3A.

FIG. 5A is a perspective view of the exemplary printed circuit board of FIG. 4A with various lead wires coupled to the printed circuit board.

FIG. 5B is a top view of the exemplary printed circuit board of FIG. 5A.

FIG. 8 is a bottom view of the exemplary printed circuit board of FIG. 6.

FIG. 10A is a perspective view of the exemplary core pack of FIG. 3A with potting material applied.

FIG. 10B is a top view of the exemplary core pack of FIG. 10A.

FIGS. 11A and 11B are additional views of the circuit board of FIG. 6 encased in low pressure molded material and connected to various lead wires.

FIG. 12 is a side view of an exemplary embodiment of a core pack of the battery pack of FIG. 1.

FIG. 13 is a side view of another exemplary embodiment of a core pack of the battery pack of FIG. 1.

FIG. 14 is a side view of another exemplary embodiment of a core pack of the battery pack of FIG. 1.

FIG. 17 is another exemplary embodiment of a core pack of the battery pack of FIG. 1.

FIG. 21 is a plan view of an exemplary embodiment of a jumper link of the battery pack of FIG. 1.

FIG. 27 is a plan view of the terminal of FIG. 26B being welded to a wire.

DETAILED DESCRIPTION

Figure 1:
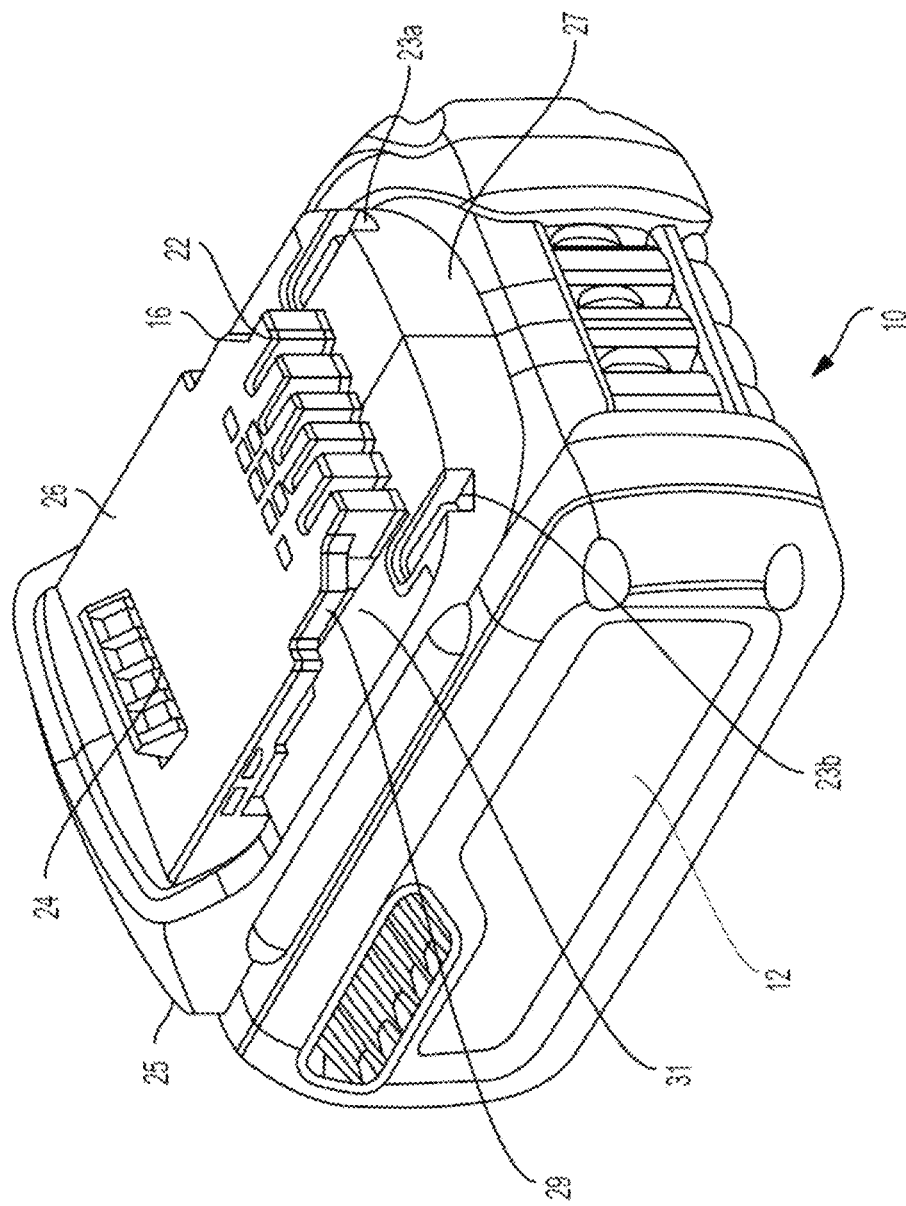
FIG. 1 is a perspective view of an exemplary embodiment of a battery pack of the present disclosure.

Referring to FIG. 1, there is illustrated an exemplary embodiment of a battery pack 10 of the present disclosure. This exemplary battery pack 10 is a convertible battery pack capable of switching between a low voltage configuration (for example, a 20 volt output) and a medium voltage configuration (for example, a 60 volt output) similar to the battery pack disclosed in U.S. Pat. No. 9,406,915 herein incorporated by reference and sold as FlexVolt™ battery packs by DeWalt™. The battery pack 10 includes a housing 12 for holding a battery core pack 14 and other components. The housing 12 includes a mechanical interface 16 for coupling with an associated powered device, such as a cordless power tool, e.g., circular saw, drill. The mechanical interface 16 includes a plurality of slots 18 in an upper portion 20 of the housing 12. A first group of these slots 22 are positioned so as to allow terminals of the associated powered device to enter the battery pack housing 12 and mate with corresponding terminals (discussed below) of the battery pack 10. The housing 12 also includes an opening that receives a latch 24 for latching the battery pack 10 to the associated power device. By necessity, the slots 22 and latch opening provide access for contaminants, such as water and dust and metal shards, into the battery pack housing 12. The mechanical interface 16 of the battery pack housing 12 also includes a set of rails 29 that form a set of grooves 31. The rails 29 and grooves 31 are configured to mate with a corresponding set of rails and grooves on the various power devices that are designed to mate with the battery pack 10. The mechanical interface 16 also includes a second set of slots 23a, 23b. These slots are configured and designed to mate with a corresponding converter element of a subset of the various power devices, e.g. 60 volt cordless power tools.

Figure 2:
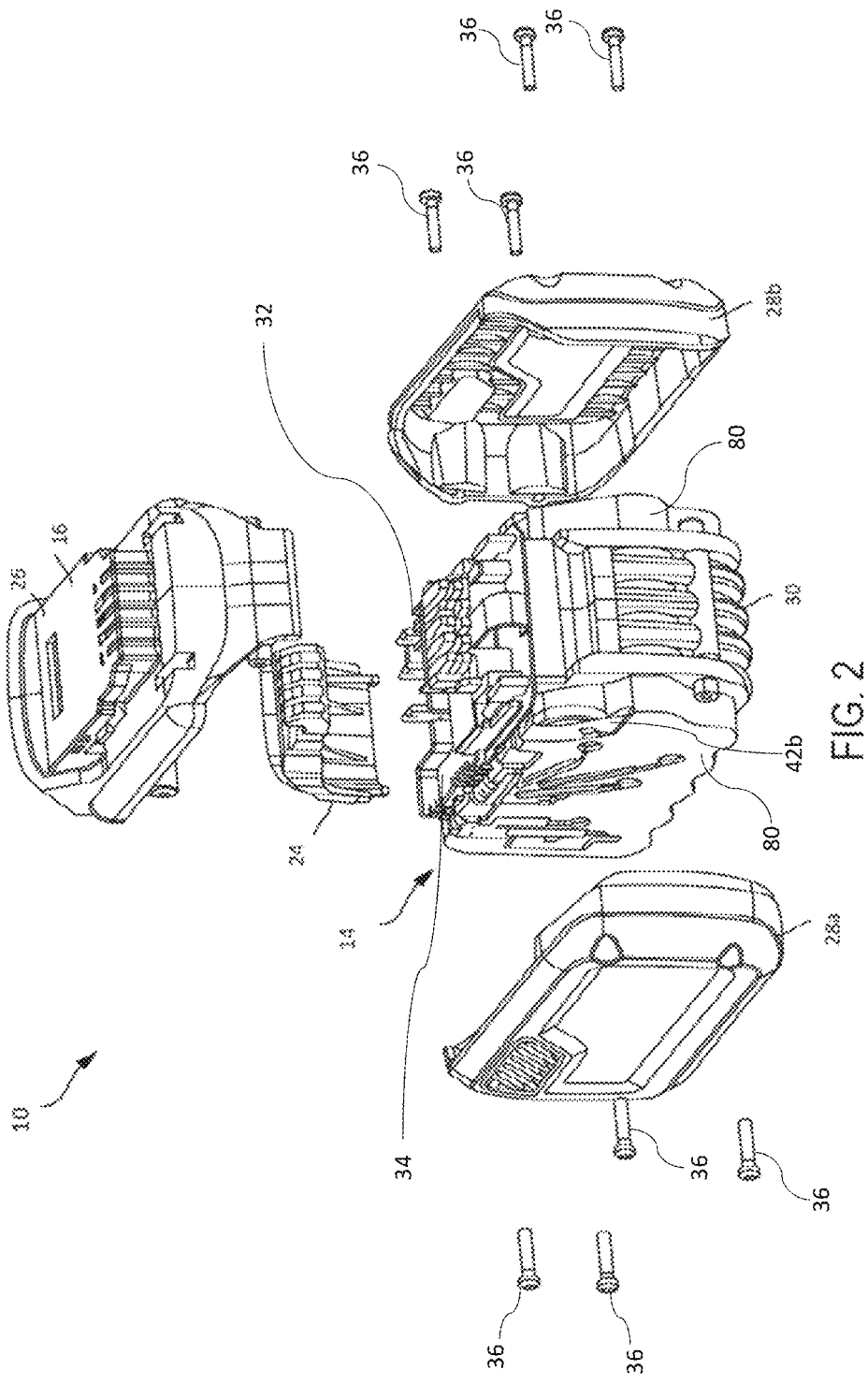
FIG. 2 is an exploded view of the exemplary battery pack of FIG. 1.

Referring also to FIG. 2, there is illustrated an exploded view of the battery pack 10 of FIG. 1 and FIGS. 3A and 3B, there is illustrated a side perspective view and a top view of an exemplary core pack of the present disclosure. In this particular exemplary battery pack 10, the housing 12 includes a forward portion 25, a top portion 26, a rearward portion 27 and two side portions 28a, 28b. The battery pack also includes the core pack 14. The core pack 14 includes a cell holder 30, a plurality of battery cells 78 held in a fixed position relative to each other by the cell holder 30, a terminal block assembly 32, a converter element housing 31, and a printed circuit board 34. The core pack 14 also includes a plurality of lead wires 40 coupling the battery cells (via various battery straps) to the PCB 34 and the PCB 34 (via board flag terminals) to the battery pack terminals 46 of the terminal block assembly 32. The PCB 34 is populated with a plurality of various electronic components 48, such as resistors, integrated circuits, capacitor, etc. This illustration does not include any potting material applied to the PCB 34. When assembled, the top portion 26 is placed on the core pack 14 and the two side portions 28a, 28b of the housing 12 are placed on either side of the core pack 14. In this example, the cell holder 30 serves as a front and rear portion of the housing 12. The side portions 28a, 28b hold the top portion 26 in place and the side portions 28a, 28b are fastened to the cell holder 30 by a plurality of fasteners 36, such as screws.

As will be discussed in more detail below, a low pressure molded material 66, for example, a thermoplastic polyamide such as that sold by Henkel under the tradename Technomelt PA646, partially encapsulates the PCB 34. One side of the PCB 34 is positioned on the core pack 14 to abut the converter element housing 38 for the converter element. A portion of a second side of the PCB 34 is positioned on the core pack 14 to abut a standoff 52. The standoff 52 may be used to position the top housing 26 relative to the core pack 14. The standoff 52 and the converter element housing 38 assist in positioning the PCB 34 on the core pack 14 and help define a volume along with a top side 60 of the PCB 34 and a potting wall 68 created by the low pressure molded material, as discussed in further detail below.

In addition, several lead wires 40 connect the various battery straps 42 to the PCB 34. A first end of the lead wire 40 is coupled, typically by soldering or welding, to the battery strap 42. A second end of the lead wire 40 is connected to a connector 58 on the PCB 34. The connector 58 may include a set of pins to fix the end of the lead wire 40 to the connector 58. The PCB connector 58 and the second end of the lead wire 40 are encapsulated by the low pressure molded material 66 during the molding process. This seals the wire connections at the PCB connector 58 and protects the exposed wires and connectors 58 from contaminants.

As described in more detail below, the PCB assembly including the populated PCB 34, the PCB connectors 58, the lead wires 40 and low pressure molded material 66 are placed on the cell holder to provide the core pack 14 illustrated in FIGS. 3A and 3B.

After the PCB assembly is placed on the cell holder 30, the PCB assembly may be affixed to the cell holder 30 by various fasteners, as is well known in the art. The lead wires 40 are coupled to the associated, corresponding battery straps 42, and the terminal flags 44 are coupled to the associated, corresponding battery terminals 46.

Figures 4A, 4B:
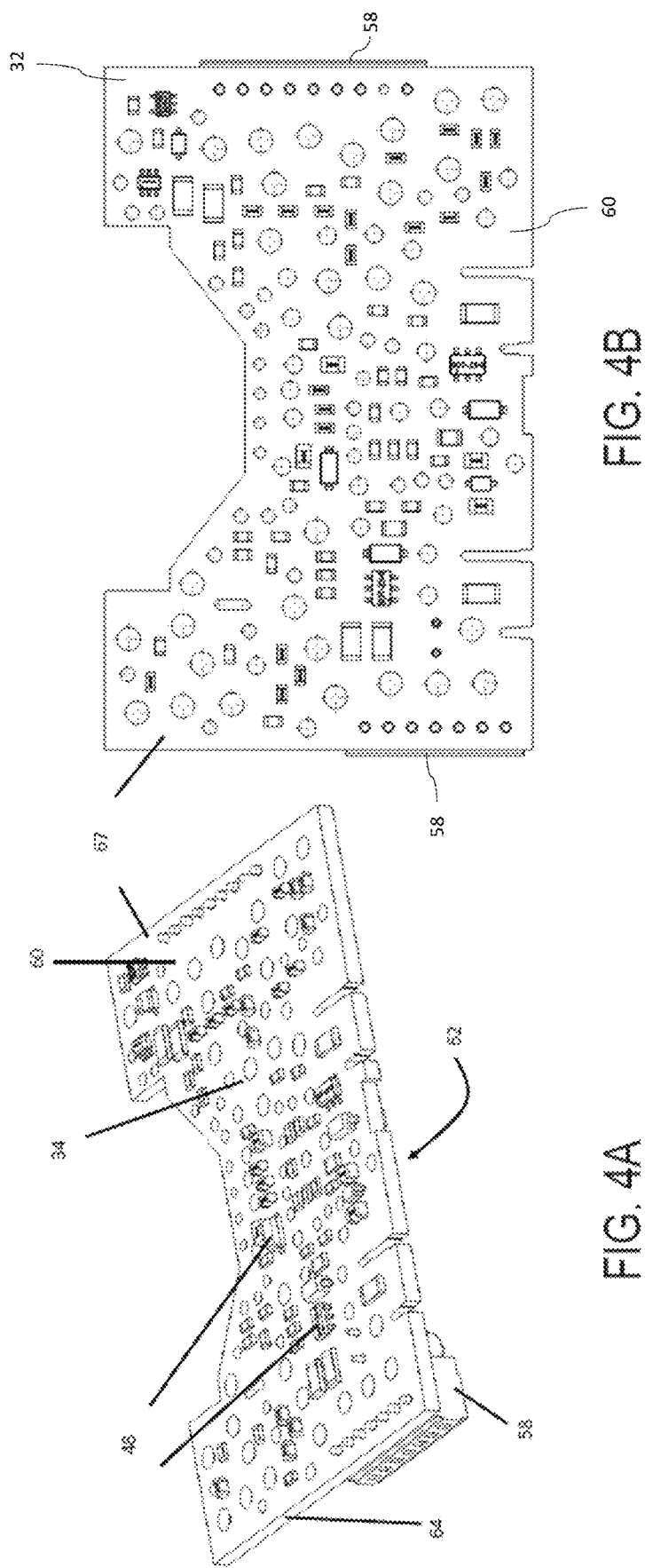
FIG. 4A is a perspective view of an exemplary populated printed circuit board of the core pack of FIG. 3A.
FIG. 4B is a top view of the populated printed circuit board of FIG. 4A.

As illustrated in FIGS. 4A and 4B, the printed circuit board 34 for the battery pack 10 includes a top surface 60, a bottom surface 62 and a perimeter wall 64 coupling the top surface 60 and the bottom surface 62. Both the top surface 60 and the bottom surface 62 may be populated with a plurality of various electronic components 48, such as integrated circuit, resistors, capacitors, etc., as is well known in the art. In the illustrated exemplary embodiment, a pair of connectors 58 are populated on the bottom surface 62 of the PCB 34 for receiving lead wires 40.

As illustrated in FIGS. 5A and 5B, the lead wires 40 are coupled to the connectors 58.

Figure 6:
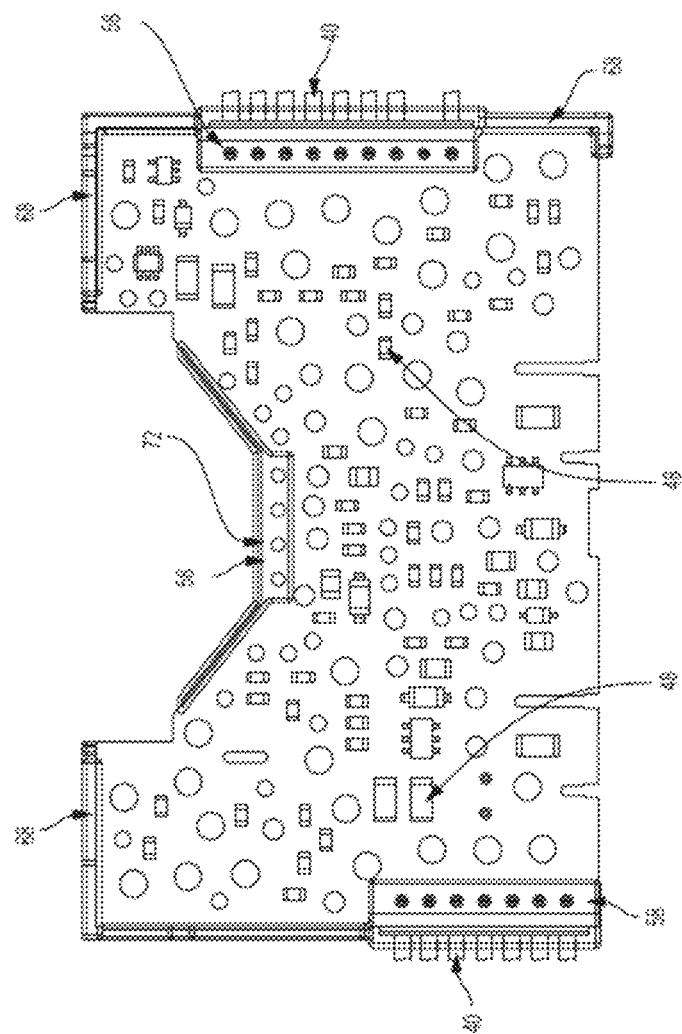
FIG. 6 is a top view of the exemplary printed circuit board of FIG. 5B partially encased in low pressure molded material.
Figure 7:
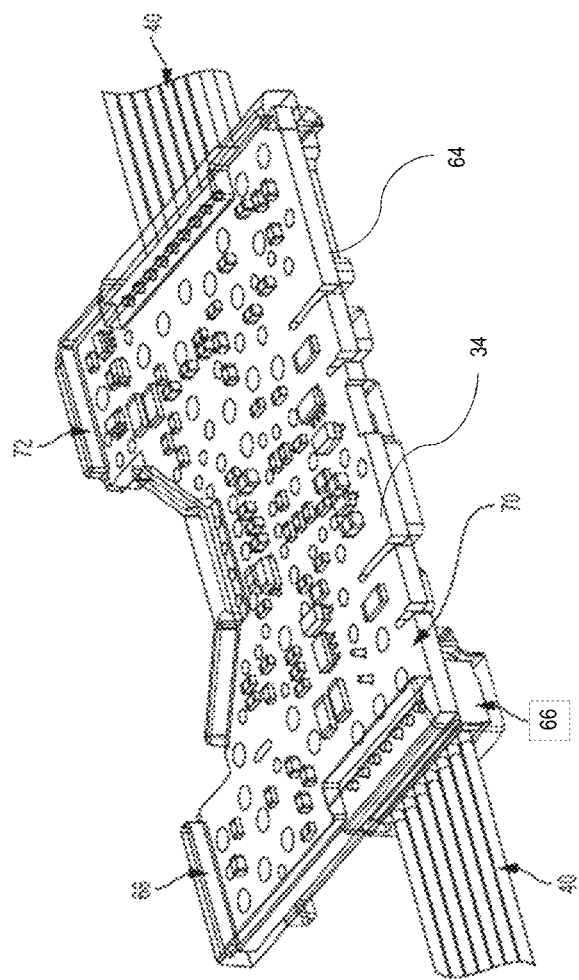
FIG. 7 is a perspective view of the exemplary printed circuit board of FIG. 5A partially encased in low pressure molded material.

As illustrated in FIGS. 6, 7, and 8, a low pressure molded (LPM) material 66, such as a thermoplastic polyamide, is applied to the PCB 34. The LPM material 66 may be applied to the bottom side 62 of the PCB 34 as is illustrated in FIG. 8. In this instance, the LPM material 66 encapsulates the wire connectors 58 and the ends of the wires 40 and provides a seal around the wires 40 thereby preventing contaminants, such as water, from entering the wire connectors 58. As illustrated in FIGS. 6 and 7, the LPM material 66 may be applied along and encapsulate a portion of the perimeter wall 64 of the PCB 34. In this instance, the LPM material 66 may overlap and encapsulate a portion 67 of the top surface 60 of the PCB 34 adjacent to the intersection of the top surface 60 of the PCB 34 and the perimeter wall 64 of the PCB 34. Furthermore, the LPM material 66 may be molded such that a potting wall 68 is formed around and encapsulates a portion of the perimeter of the PCB 34. The potting wall 68 extends generally perpendicularly to the top surface 60 of the PCB 34 and generally parallel to the perimeter wall 64 of the PCB 34. The potting wall 68 along with the top surface 60 of the PCB 34 form a volume 70. The potting wall 68 and the top surface 60 of the PCB 34 may be referred to as a potting boat 72.

Figure 9B:
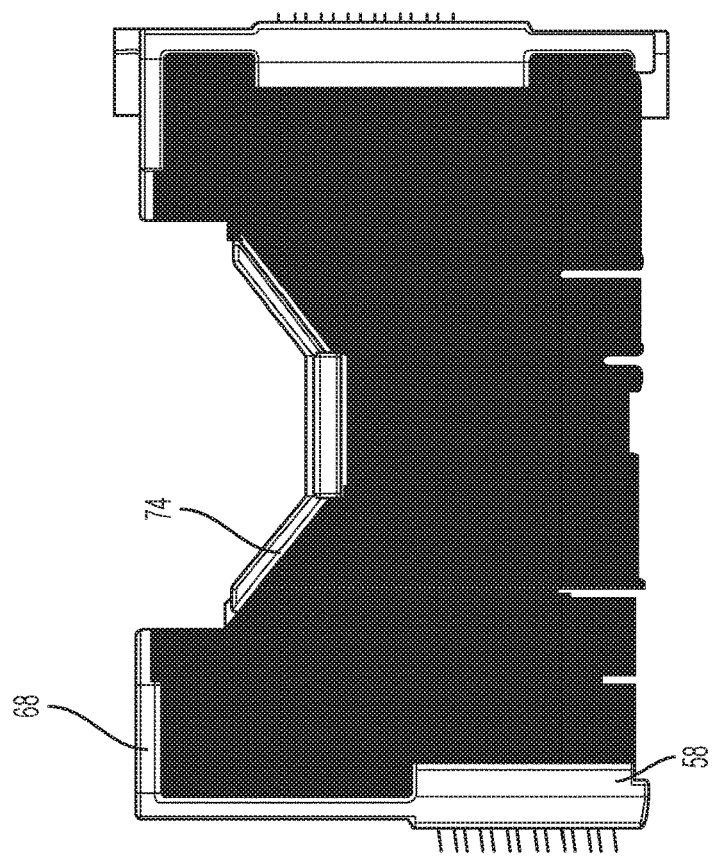
FIG. 9B is a top view of the exemplary printed circuit board of FIG. 9A.
Figure 9A:
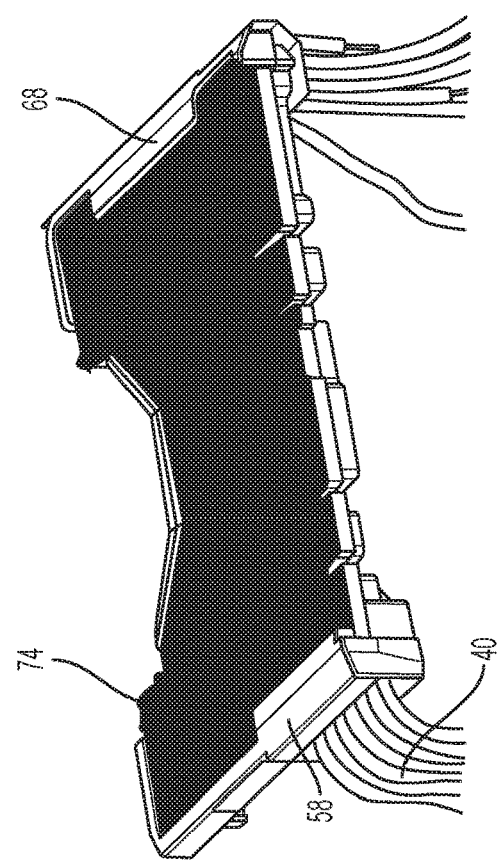
FIG. 9A is a perspective view of the exemplary printed circuit board of FIG. 7 with a conformal coating material applied.

In a first process, as illustrated in FIGS. 9A and 9B, after the LPM material 66 is molded onto the PCB 34, a potting material or conformal coating material 74 may be applied to the top surface/side 60 of the PCB 34 in the volume 70 created by the potting wall 68 and the top side 60 of the PCB 34. Thereafter, the PCB assembly with the potting material 74 is coupled to the cell holder 30 and the lead wires 40 are attached to the appropriate straps, as illustrated in FIGS. 10A and 10B.

In a second process, the PCB assembly is joined with the cell holder 30 and then a potting material (such as thermosetting plastics or silicone rubber gels) or a conformal coating material (such as an acrylic, an epoxy, polyurethane, or a silicone) is applied to a top surface 60 of the PCB 34 in the volume 70 defined by the potting boat 72 comprising the LPM material 66 and the top surface 60 of the PCB 34.

In this second process, as illustrated in FIGS. 10A and 10B, the converter element housing 38 and the standoff 52 along with the potting wall 68 and the top surface 60 of the PCB 34 may serve to define the potting boat volume 70. In alternate embodiments, the LPM material 66 may be molded about the PCB 34 to form a potting wall 68 about the entire perimeter of the PCB 34. This will depend upon the particular battery pack and core pack to which the PCB is being used.

By using a LPM material 66 to create the potting wall 68, the volume 70 for a potting material or conformal coating material 74 can be created in a much more efficient process than if an insert molded plastic part is created which is then attached to the PCB to create a potting volume.

FIGS. 11A and 11B illustrate enhanced views of the lead wires 40 coupled to the connectors 58 as they are encapsulated in the LPM material 66.

Referring to FIG. 12, an exemplary embodiment of the core pack 14 includes a plurality of battery cells 78. The battery cells 78 are housed in the plastic cell holder 30 and end caps 80. The end caps 80 include recesses/cutouts 82 which expose the positive or negative poles of the battery cells 78. The core pack 14 also includes metal conductors 42 (also referred to as power straps or battery straps) positioned in the recesses 82 that electrically couple a negative pole of a first battery cell to a positive pole of a second battery cell to connect the cells in series or connect a battery cell pole to a circuit board which provides current from the cells to a connected device.

In order to protect or insulate the power straps 42 from water or other particulates, an amount of room temperature vulcanized (RTV) silicone 84 or a similar encapsulate coating is applied in the recess 82 to fully or partially cover the power strap 42. FIG. 12 illustrates a single power strap 42a having the RTV silicone 84 applied thereto, however some or all of the power straps 42 may have RTV silicone 84 applied thereto. The RTV silicone prevents water or other particulates from the power traps 42.

Referring to FIGS. 12, 13 and 14, in certain instances a first power strap 42a—which in conventional battery packs is not insulated—is overlapped by a portion of a second power strap 42b—which is also not insulated. If a short, caused for example by water or metal particulates, bridges between the two power straps 42a, 42b, undesired heating may occur.

In order to address this issue, the first power strap 42a housed in one of the recesses 82 in the end cap 80. An amount of the RTV silicone 84 or similar encapsulate coating is applied in the recess 82 to fully or partially cover the power strap 18a. In another exemplary embodiment of the core pack 14, a dielectric, high temperature insulator 86 is placed over the RTV silicone 22. The insulator 86 is pressed into the recess 82 thereby compressing the RTV silicone 84 until the RTV silicone 84 expresses around the insulator 86 and effectively creates a seal to prevent liquid or fine particulate contaminants from contacting the first battery cell 78 or the first battery strap 42a. Referring to FIG. 14, the second power strap 42b is placed on the battery core pack 14 overlapping a portion of the first power strap 42a. The RTV silicone 84 and the insulator 86 provide an insulating layer between the first power strap 42a and the second power strap 42b. This effectively prevents a short from occurring between the first and the second power straps 42a, 42b. In an alternate exemplary embodiment of the core pack 14, the insulator 86 may be omitted such that only the RTV silicone 22 is positioned between the two battery straps 42a, 42b. In another alternate exemplary embodiment of the core pack 14, the RTV silicone 84 may be omitted such that only the insulator is positioned between the two battery straps 42a, 42b.

Referring to FIG. 14, RTV silicone adhesive coatings 84 and/or insulator pads 86, in either custom or generic shapes, may be applied to some or all of the recesses 82 of the battery core pack 14 to seal all of the positive poles of the battery cells 78 and the associated battery straps 42 or all of both the positive and the negative poles of the battery cells and the associated battery straps. The battery core pack 14 illustrates the RTV adhesive coating 84 applied to several of the battery straps 42 or having the adhesive coating 84 and the insulating pad 86 applied to the battery straps 42. The adhesive coating 84 and/or the insulating pad 86 may be applied to all of or less than all of the battery straps 42, depending upon the cell layout and the voltage differentials between adjacent cells and associated power straps.

The RTV adhesive 84 may also be applied to the lead wires 40 at the connection to the battery straps 42, as illustrated in FIG. 14.

Figure 15:
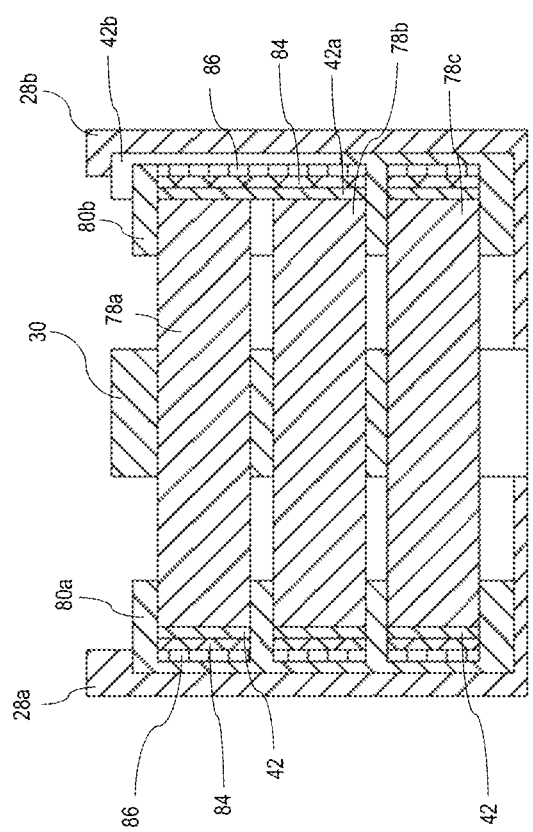
FIG. 15 is a cross sectional view of the core pack of FIG. 14.

FIG. 15 illustrates a cross section view of the core pack 14 along line 15-15 of FIG. 14. As illustrated in FIG. 15, three battery cells 78a, 78b, 78c are held in fixed relation to each other by the cell holder 30 and the end caps 80a, 80b. The first battery strap 42a connects the first battery cell 78a to the second battery cell 78b. The RTV silicone (encapsulating material) 84 is applied and positioned in the recess 82a exposing the first battery strap 42a to cover the first battery strap 42a. The insulating pad 86 is applied to and positioned in the recess 82a to cover the RTV silicone 84. The second power strap 42b connects the third battery cell 78c and a printed circuit board 34 (as illustrated in FIG. 2). The RTV silicone 84 and the insulating pad 86 insulate the first battery strap 42a and the second battery strap from each other.

Figure 16:
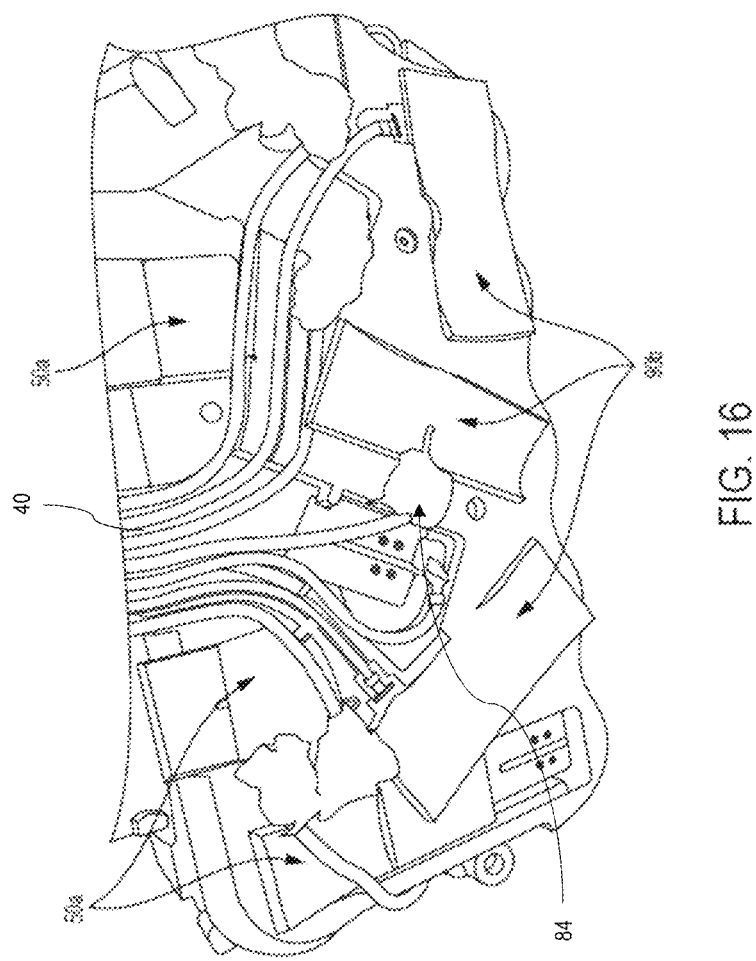
FIG. 16 is a perspective view of another exemplary embodiment of a core pack of the battery pack of FIG. 1.

Referring to FIG. 16, another exemplary embodiment of a core pack 14 is illustrated. In this embodiment, one or more gaskets 90 may be placed over the positive poles of the battery cell 78 to keep fine dust particulate out. In a first embodiment, the gaskets 90 are placed over only the positive battery cell poles. In a second embodiment, the gaskets 90b are placed over both the positive battery cell poles and the negative battery cell poles to give further protection against liquid contamination. The silicone gasket pads 90 are sized such that they can fit many different cell/strap shapes and such that they are oversized to the recess 82 such that the gasket pads 90 wrap up and over the walls of the recess 82 of the end cap 80 to provide a seal for the recess 82 and enclose the battery strap 42. The RTV silicone 84 may also be applied to the battery straps 42 without a gasket 90. The RTV silicone 84 may also be applied to the lead wires 40 to provide additional protection.

Referring to FIG. 17, another exemplary embodiment of the core pack 14 is illustrated. In this embodiment, the RTV silicone material 84 is applied to the end caps 80 between battery straps 42c, 42d having a high voltage differential. For example, the voltage differential between the third battery strap 42c and the fourth battery strap 42d could be 20V. The side portions 28a, 28b are then assembled to the battery core pack and pressed against the RTV silicone 84—effectively forming a seal. A gasket could be used as an alternate to the RTV silicone.

Figure 18B:
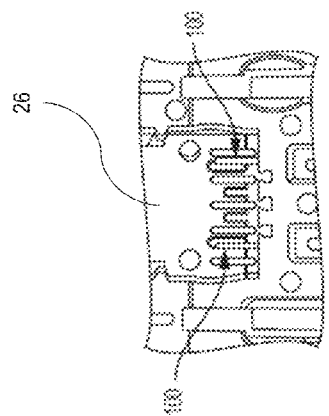
FIG. 18B is a bottom/interior view of an exemplary embodiment of the top housing of the battery pack of FIG. 1.
Figure 18A:
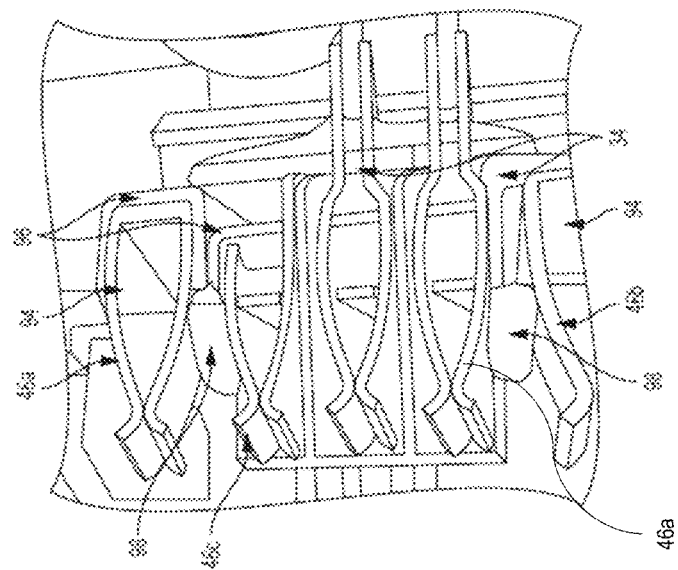
FIG. 18A is a top view of a terminal block of the battery pack of FIG. 1.

FIG. 18a illustrates an exemplary embodiment of terminal block assembly 32. In order to prevent water, dust, metal shavings or other particulates from connecting adjacent battery terminals 46, a high temperature, high dielectric tape 94 such as Kapton are placed over the battery pack positive power terminal (B+) 46a and the battery pack negative power terminal (B-46b. The tape 31 blocks any possible creepage path to nearby terminals of high voltage differential, for example signal terminal 46c.

In one exemplary embodiment, clear RTV silicone 96 is applied along certain exposed metal edges of power terminals 46a, 46b and/or signal terminals 46, to provide redundancy to the tape 94.

In addition or alternatively, white RTV silicone 98 is applied vertically between terminals 46 of high voltage differential, for example power terminals 46a and signal terminals 46c and/or power terminal 46b and signal terminal 46d. Referring to FIG. 18b, there is illustrated an exemplary embodiment of an interior surface of the top portion 16 of the battery pack 10. The top portion 16 includes ribs 100 extending from the interior surface of the top portion 16. When the top portion 26 is mated with the core pack 14, the ribs 100 make contact with the white RTV silicone 98 while still wet to seal the terminals 46a, 46c and 46b, 46d from bridging when exposed to liquid or particulate contamination.

Figure 19B:
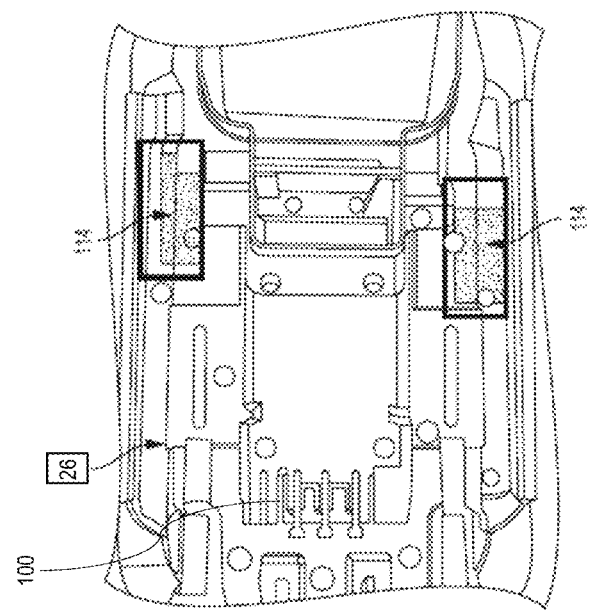
FIGS. 19A and 19B are interior views of another exemplary embodiment of the top housing of the battery pack of FIG. 1.
Figure 19A:
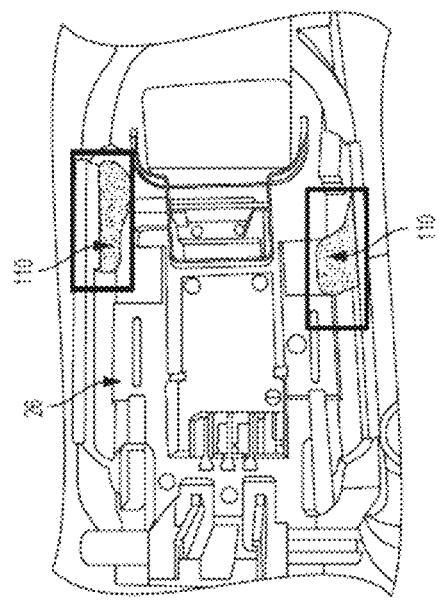

Referring to FIG. 19a, another exemplary embodiment of the top portion 10 is illustrated. As illustrated a flowable glue 110, such as RTV is applied onto the interior surface of the battery top housing. As such, when the battery top housing 26 is assembled onto the battery core pack 14 the glue 110 will cover areas of high voltage differential, for example between adjacent battery straps 42.

Referring to FIG. 19b, a "texture mark" 114 may be added to the top housing 26 to aid operators in applying the glue 110 to proper location.

Figure 20B:
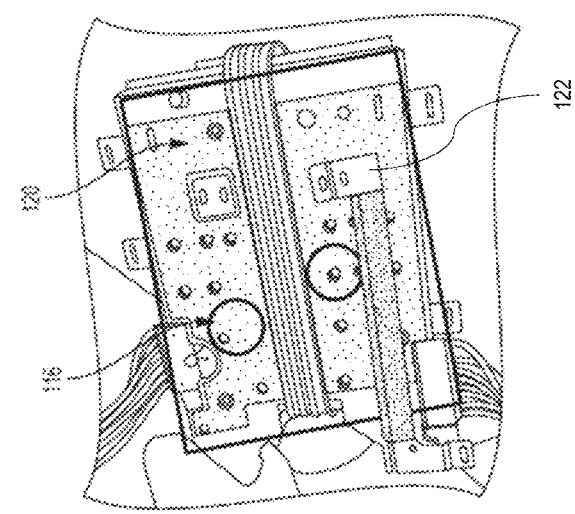
FIG. 20B is a bottom view of the converting element of FIG. 20A.
Figure 20A:
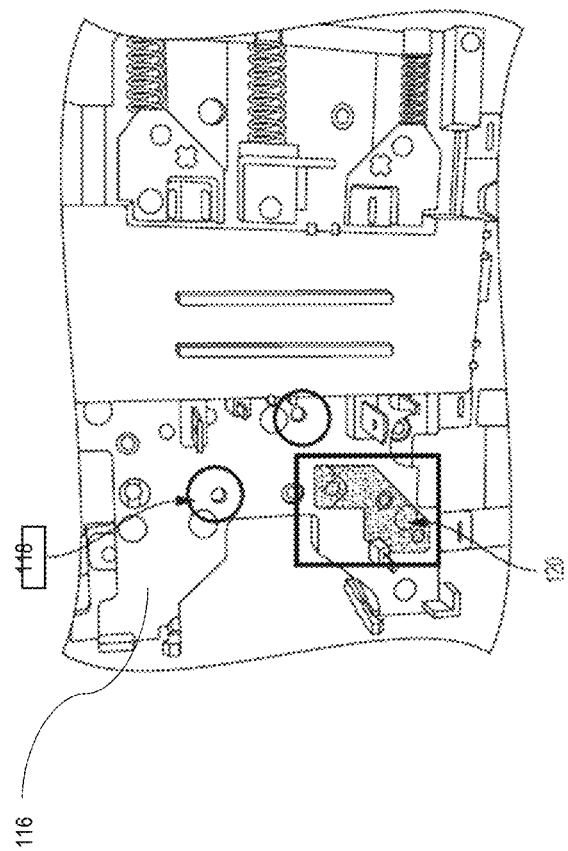
FIG. 20A is a top view of an exemplary embodiment of a converting element of the battery pack of FIG. 1.

Referring to FIGS. 20a and 20b, in order to manufacture a battery pack 10 including a converter element (internal switching network) utilizing a plastic board 116 incorporating various metal traces in a cost effective manner, a plurality of holes 118 with exposed metal are created on the board 116. The exposed metal presents a risk for potential contamination bridging.

This risk could be addressed by secondary overmolding, which is costly and adds no value to the part or user beyond contamination protection. Alternatively, a lower cost, more simple option is to use simple pieces of tape 120, for example, die-cut tape to cover exposed metal that are present in areas of relatively high voltage differential.

Referring to FIGS. 20b and 21, a metal conductor 122 is used to connect a first terminal on the converter element to the battery cells 78. A metal jumper link 122 was chosen for this purpose due to its ability to conduct high currents in a low profile shape.

In order to prevent contamination from bridging the jumper link 122 (which is at 0V potential) to all other high potentials (wire connectors, exposed metal of the board or core pack, etc.), a high temp, high dielectric material 124, such as Kapton tape, is applied to the jumper link 122.

Figure 22:
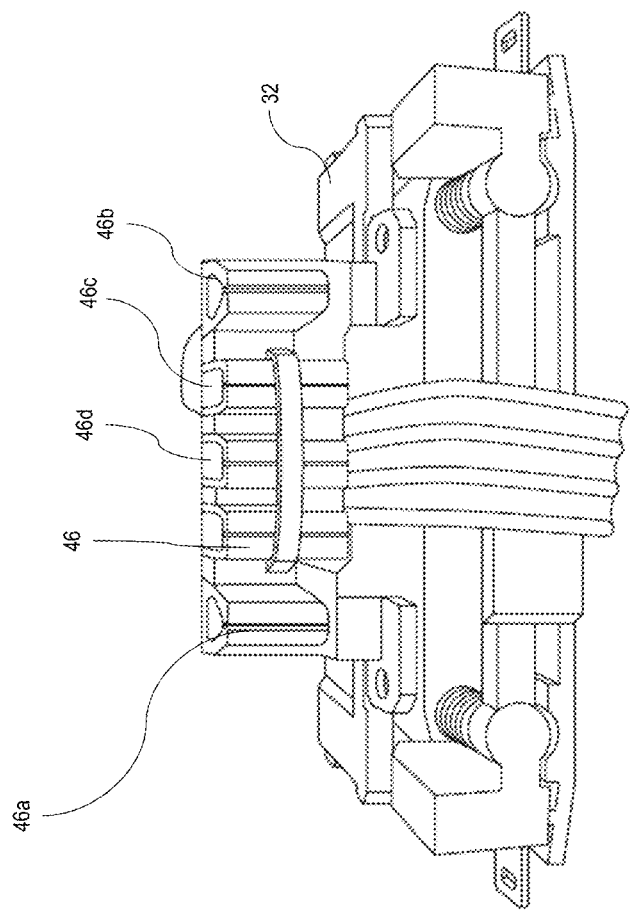
FIG. 22 is a forward view of an exemplary embodiment of a terminal block of the battery pack of FIG. 1.
Figure 23A:
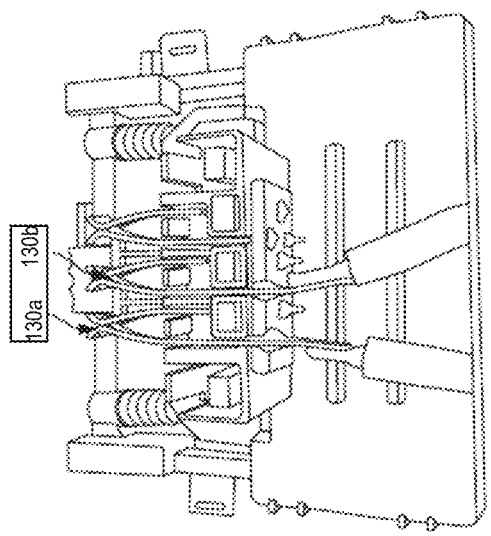
FIG. 23A is a perspective view of a conventional terminal block.
Figure 23B:
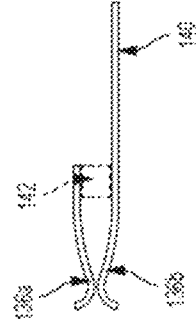
FIG. 23B is a plan view of the terminal block of FIG. 23A.
Figure 24A:
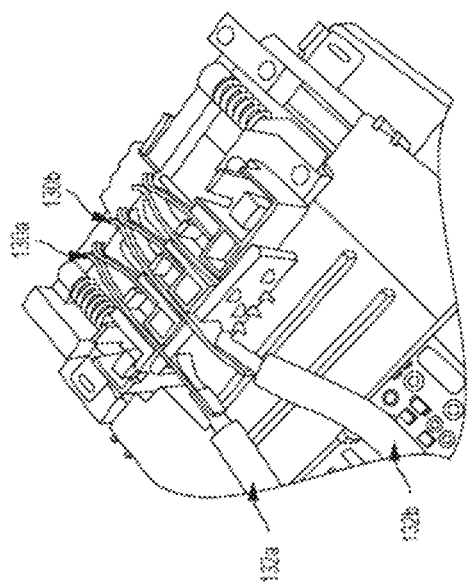
FIG. 24A is a perspective view of a conventional power terminal of the terminal block of FIG. 23A.
Figure 24B:
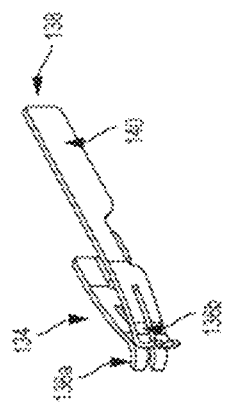
FIG. 24B is a plan view of the terminal of FIG. 24A.
Figure 25B:
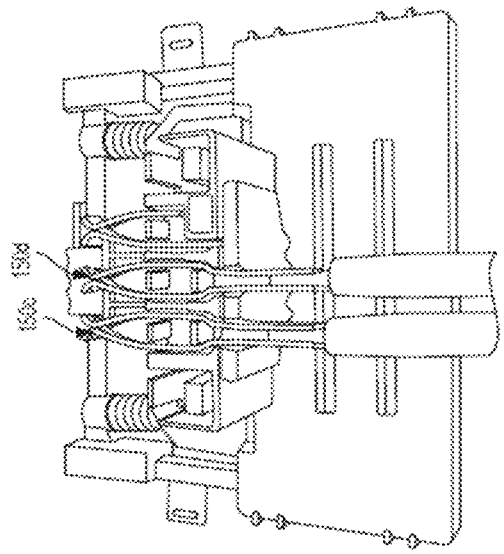
FIG. 25B is a top plan view of the terminal block of FIG. 25A.
Figure 26B:
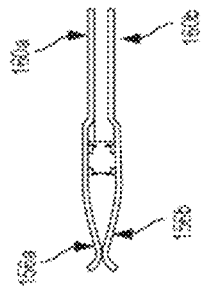
FIG. 26B is a top plan view of the terminal of FIG. 26A.
Figure 25A:
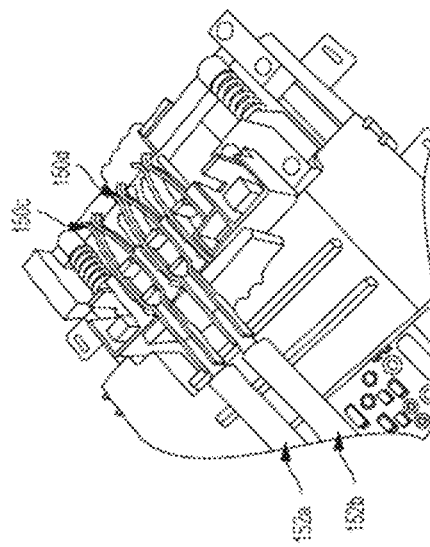
FIG. 25A is a perspective view of an exemplary embodiment of a terminal block of the battery pack of FIG. 1.
Figure 26A:
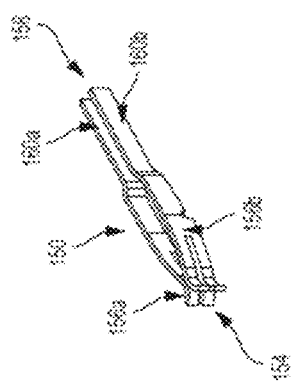
FIG. 26A is a perspective view of a power terminal of the terminal block of FIG. 25A.

Referring to FIG. 22, another exemplary embodiment of the terminal block assembly 32 is illustrated. In this embodiment, a dielectric grease is applied to the battery terminals/contacts 46 to prevent arcing between adjacent terminals due to contaminants.

Referring to FIGS. 23A, 23B, 24A and 24B, there is illustrated a set of conventional battery pack power terminals 130a, 130b electrically connected to wires 132a, 132b. The wires 132 are coupled to the battery cells 78 (not shown) to provide power from the battery cells 78 to the power terminals 130a, 130b for providing power from the battery pack 10 to a connected/mated power tool to power the power tool motor. The conventional power terminals 130 includes a forward end 134 presenting two contact portions 136a, 136b configured in a tulip-like shape to mate with a corresponding power terminal of the connected power tool and a rearward end 138 presenting a single contact portion 140 configured coupled to the battery cell wire 132.

In this configuration, any current flowing from the battery cells 78 through the cell wires 132 and the power terminals 130 will converge at coupling point 142 where the single contact portion 140 meets the two contact portions 136a, 136b. This will increase resistance and corresponding heat.

Referring to FIGS. 25A, 25B, 26A, and 26B, there is illustrated an exemplary embodiment of a set of battery pack power terminals 150c, 150d of the present invention (The power terminals 150c, 150d are also illustrated as terminals 46c, 46d in FIGS. 3A, 3B and 22) electrically connected to wires 152a, 152b. The wires 152a, 152b are coupled to the battery cells 78 to provide power from the cells to the power terminals 150c, 150d for providing power from the battery pack 10 to a connected/mated power tool to power the power tool motor. The presently presented power terminals 150c, 150d includes a forward end 154 presenting two contact portions 156a, 156b configured in a tulip-like shape to mate with a corresponding power terminal of the connected power tool and a rearward end 158 presenting two contact portions 160a, 160b configured to couple to the battery cell wire 152.

In this configuration, any current flowing from the battery cells 78 through the cell wires 152a, 152b and the presently presented power terminals 150c, 150d will flow more evenly where the two contact portions 160a, 160b meet the two contact portions 156a, 156b. This will increase reduce resistance and corresponding heat as compared to the conventional power terminal.

Referring to FIG. 27, the wire 152a is first pre-welded to give it a prismatic shape. After the wire 152a has been pre-welded, the two contact portions 160a, 160b of the terminal 150 and the wire 152 are placed into a fixture and resistance welded.

Numerous modifications may be made to the exemplary implementations described above. These and other implementations are within the scope of this application.

The invention claimed is:

1. An encapsulated printed circuit board, comprising:
a printed circuit board having a top side, a bottom side and a perimeter wall coupling the top side and the bottom side;
a low pressure molded material applied to at least a portion of the perimeter wall such that a portion of the low pressure molded material extends (1) generally perpendicularly to the top side and (2) generally parallel to the perimeter wall to create a potting wall extending from the top side at the at least a portion of the perimeter wall, the potting wall and the top side forming a volume; and
a potting material filling the volume.

2. The encapsulated printed circuit board of claim 1, wherein the low pressure molded material encapsulates the bottom side.

3. The encapsulated printed circuit board of claim 1, wherein the low pressure molded material encapsulates a portion of the top side adjacent to an intersection of the top side and the perimeter wall.

4. The encapsulated printed circuit board of claim 1, wherein the low pressure molded material is a thermoplastic polyamide.

5. The encapsulated printed circuit board of claim 1, further comprising at least one lead wire coupled to the printed circuit board and wherein the low pressure molded material encapsulates a portion of the at least one lead wire coupled to the printed circuit board.

6. The encapsulated printed circuit board of claim 3, wherein the potting wall extends from the top side from the portion of the top side adjacent to the intersection of the top side and the perimeter wall.

7. An encapsulated printed circuit board, comprising:
a printed circuit board having a top side, a bottom side and a perimeter wall coupling the top side and the bottom side;
a low pressure molded material molded about a majority of the bottom side and at least a portion of the perimeter wall such that a potting wall extends generally perpendicularly to the top side and generally parallel to the perimeter wall at the at least a portion of the perimeter wall, the potting wall and the top side forming a volume; and
a potting material filling the volume.

8. The encapsulated printed circuit board of claim 7, wherein the low pressure molded material is a thermoplastic polyamide.

9. A method of encapsulating a printed circuit board, comprising the steps of:
providing a printed circuit board having a top side, a bottom side and a perimeter wall coupling the top side and the bottom side;
populating the printed circuit board with a plurality of electronic components;
applying a low pressure molded material to at least a portion of the perimeter wall such that a portion of the low pressure molded material extends (1) generally perpendicularly to the top side and (2) generally parallel to the perimeter wall thereby creating a potting wall extending from the top side at the at least a portion of the perimeter wall.

10. The method as recited in claim 9, wherein creating the potting wall extending from the top side forms a volume defined by the top side and the potting wall and further comprising the step of filling the volume with a potting material.

11. A method of encapsulating a printed circuit board, comprising the steps of:
providing a printed circuit board having a top side, a bottom side and a perimeter wall coupling the top side and the bottom side;
populating the printed circuit board with a plurality of electronic components;
molding a low pressure molded material about a majority of the bottom side and at least a portion of the perimeter wall to form a potting wall that extends generally perpendicularly to the top side and generally parallel to the perimeter wall at the at least a portion of the perimeter wall, the potting wall and the top side defining a volume; and
further comprising the step of filling the volume with an encapsulating material.

* * * * *